United States Patent

Bartlow

[11] Patent Number: 5,949,649
[45] Date of Patent: Sep. 7, 1999

[54] HIGH POWER SEMICONDUCTOR DEVICE HAVING BOLT-DOWN CERAMIC PLATFORM

[75] Inventor: Howard D. Bartlow, West Linn, Oreg.

[73] Assignee: Spectrian, Inc., Sunnyvale, Calif.

[21] Appl. No.: 09/067,703

[22] Filed: Apr. 28, 1998

[51] Int. Cl.[6] ................................................. H05K 7/20
[52] U.S. Cl. ..................... 361/704; 361/707; 361/708; 361/709; 361/711; 361/719; 361/760; 361/767; 174/16.3; 174/52.1; 174/252; 165/80.3
[58] Field of Search .................... 361/688, 690, 361/702, 703, 704, 705, 706, 707, 711, 713, 717, 718, 760, 767; 257/703–707, 675; 174/16.3; 165/80.2, 80.3, 104.33

[56] References Cited

U.S. PATENT DOCUMENTS

| | | | |
|---|---|---|---|
| 3,829,598 | 8/1974 | Darnell | 174/16.3 |
| 4,394,530 | 7/1983 | Kaufman | 174/16.3 |
| 5,164,885 | 11/1992 | Drye et al. | 361/706 |
| 5,184,211 | 2/1993 | Fox | 257/706 |
| 5,338,974 | 8/1994 | Wisherd et al. | 257/691 |
| 5,485,037 | 1/1996 | Marrs | 361/702 |
| 5,510,649 | 4/1996 | Adhihetty et al. | 257/706 |
| 5,528,458 | 6/1996 | Yasuho et al. | 361/718 |

*Primary Examiner*—Leo P. Picard
*Assistant Examiner*—Boris L. Chervinsky
*Attorney, Agent, or Firm*—Townsend and Townsend and Crew LLP; Henry K. Woodward

[57] ABSTRACT

A power semiconductor device package in which a semiconductor chip is mounted on a ceramic platform and sealed thereon by a lid. The platform has opposing end portions which receive fasteners for directly fastening the platform and semiconductor device to a heat sink without the requirement of a separate mounting clamp. In one embodiment, metal films are provided on a surface of the platform adjacent to recesses for receiving the fasteners. The metal films function to distribute the stress of the fasteners over the surface of the end portions thereby minimizing the possibility of fracture of the ceramic platform.

13 Claims, 2 Drawing Sheets

5,949,649

HIGH POWER SEMICONDUCTOR DEVICE HAVING BOLT-DOWN CERAMIC PLATFORM

BACKGROUND OF THE INVENTION

This invention relates generally to the packaging and mounting of semiconductor devices in electronic circuits, and more particularly the invention relates to the packaging and mounting of high power semiconductor devices such as transistors which require heat sinks during operation.

RF power transistors are typically mounted on a ceramic platform which also supports a lead frame extending from the platform. The lead frame is interconnected with the transistor elements (e.g., emitter, base, and collector for bipolar transistor, and source, gate, and drain for field effect transistor), by wire-bonding or by solder bumps which directly engage both the lead frame and the transistor element contacts. The resulting structure, or pill, is then sealed by a lid to form the packaged transistor. The packaged transistor must be firmly mounted to a heat sink with heat from the semiconductor transistor being conducted through the ceramic platform to the heat sink.

Heretofore, a separate clamp has been employed for clamping the packaged pill-type transistor to the heat sink. However, this can result in uneven clamping force, cracking of the lid or body, and poor thermals, and ultimately lead to transistor failure. Other prior art mounting includes soldering the ceramic platform directly to the heat sink, which introduces new failure mechanisms such as thermal expansion mismatches and may increase thermal path resistance.

Disclosed in copending application Ser. No. 08/779,816 filed Jan. 6, 1997 (assigned to the present assignee) is an integral lid and clamp for a high powered transistor in which the lid is clamped directly to a heat sink without the need for a separate clamp.

The present invention is directed to an alternate power transistor device structure which does not require a separate clamp or a separate metal hold-down flange.

SUMMARY OF THE INVENTION

An object of the present invention is the elimination of a separate mounting bracket or clamp for mounting a high power semiconductor device to a heat sink.

Another object of the invention is the reduction of fabrication costs of a high power semiconductor device.

Still another object is elimination of a troublesome interface between the typical ceramic body and the metal mounting flange with the costs, thermal mismatch problems, plating difficulties and thermal resistance increases attendant to previous designs.

Briefly, and in accordance with the invention, a semiconductor chip in which a high power device is formed is mounted directly to a platform, the platform including a plurality of leads which extend from the platform and electrically contact the semiconductor chip. A lid encloses the chip on the platform. In accordance with the invention, the platform includes opposing end portions which receive fasteners for fastening the platform to a heat sink without the need for a separate mounting bracket.

In a preferred embodiment, the platform comprises a ceramic material of sufficient thickness to withstand stress from fasteners. For a beryllium oxide or aluminum nitride ceramic, the thickness of the platform is on the order of 0.120 inch (e.g., 0.08 to 0.150 inch).

In accordance with a feature of the invention, the end portions can include metal films which engage fasteners and spread stress from the fasteners over the surfaces of certain end portions of the platform. The metal film can comprise ground leads which extend from the platform and package device.

The package can be bolted directly to a heat sink without the need for a separate mounting bracket. Moreover, in one embodiment, a plurality of devices can be stacked end to end with one fastener shared by two adjacent devices.

The invention and objects and features thereof, will be more readily apparent from the following detailed description and appended claims when taken with the drawings.

DESCRIPTION OF THE PREFERRED EMBODIMENT

Figure 1:
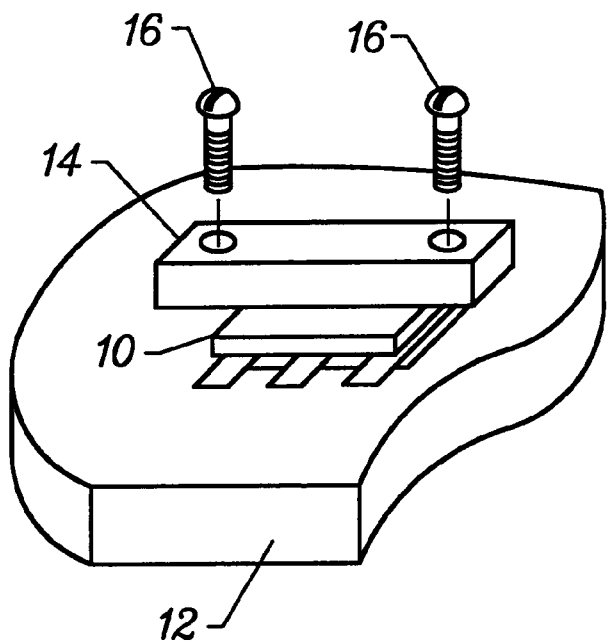
FIG. 1 is a perspective view of a packaged high-power transistor mounted on a heat sink by a separate clamp in accordance with prior art.

Referring now to drawings, FIG. 1 is a perspective view of a packaged transistor 10 mounted to a heat sink 12 by a separate clamp load spreader bar 14 which maintains the packaged transistor in pressure engagement with the heat sink by means of screws 16. As noted above, use of a separate mounting clamp can result in uneven clamping force leading to the cracking of the ceramic package lid or platform. Further, the clamp metal bar adds to the number of pieces, handling and processes required in mounting the device and thus increases the cost and difficulty in manufacture and assembly.

Figure 2:
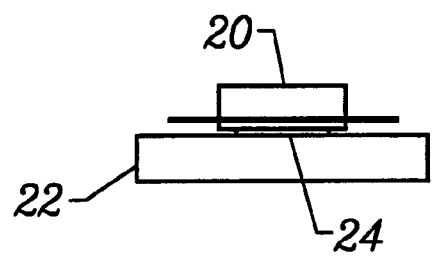
FIG. 2 is a side view of a packaged transistor with ceramic pill brazed or soldered directly to a metal flange that is then attached to a heat sink in accordance with the prior art.

FIG. 2 is a side view illustrating the mounting of the ceramic pill 20 directly to a metal flange 22 by means of solder or braised material 24. The flange is then attached to the heat sink such as by screws. However, the thermal path resistance between the packaged flange and the ceramic is increased, another material/thermal interface is added, and the cost of the plated flange is added.

Figure 3:
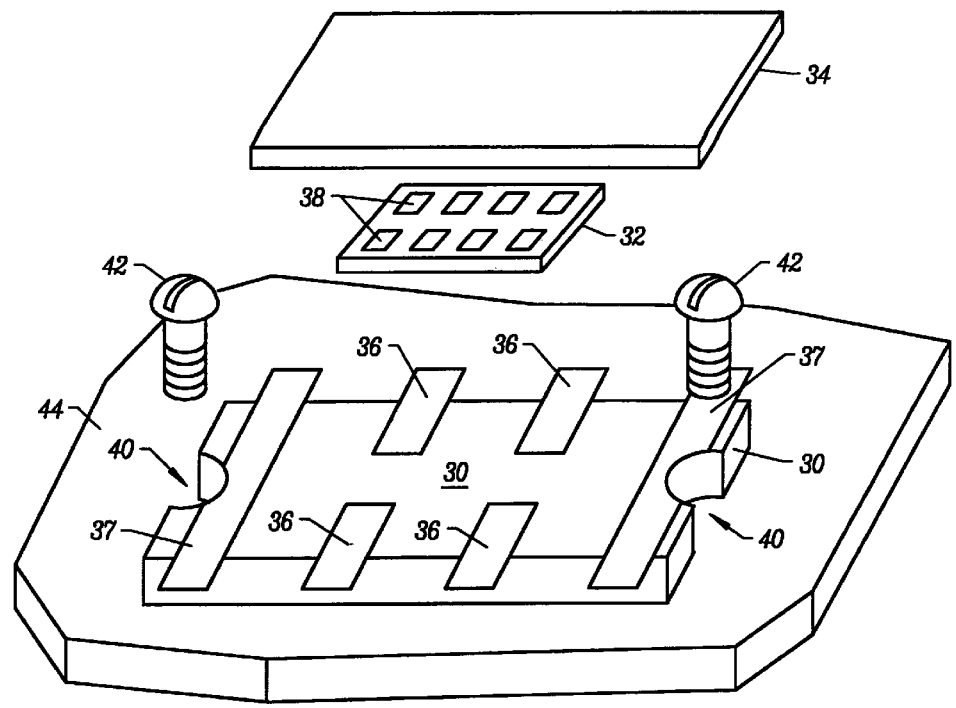
FIG. 3 is an exploded perspective view of a high-power semiconductor device package in accordance with one embodiment of the invention.

FIG. 3 is an exploded perspective view of a packaged transistor device in accordance with one embodiment of the present invention in which the platform 30 on which the semiconductive chip 32 is mounted receives fasteners for directly mounting of the packaged device to a heat sink. Lid 34 seals the chip 32 on the platform 30 with the lid being attached by means of epoxy or other suitable bonding material.

In this embodiment, leads 36 extending from the platform are electrically connected with bonding pads 38 of the semiconductor chip 32 by means of wiring bonding, for example. In accordance with a feature of the invention, the leads 37 on opposing end portions, abut holes or recesses 40 in opposing end portions which receive fasteners such as screws 42 when mounting the semiconductor device to a heat sink 44. The leads 37 can function as a ground connection and also function to spread the stress of a fastener over the surface of the ceramic platform 30 thereby reducing or eliminating the concentration of stress on high points on the surface of the ceramic platform 30. The metal films can be spaced from the edges of the opposing end portions thereby removing any mounting stress from the edges which are more susceptible to fracture.

The ceramic platform is preferably formed from a thermally conductive ceramic such as beryllium oxide or aluminum nitride and must have sufficient thickness to withstand stresses from the fasteners. In one embodiment, the thickness of the ceramic platform is on the order of 0.120 inch. The metal film abutting the recesses 40 on the platform can comprise a resilient metal such as copper, nickel, Kovar, or Alloy 42, etc. The metal need not comprise a part of a ground electrode but may be provided solely for facilitating the distribution of stress from the fasteners.

Figure 4:
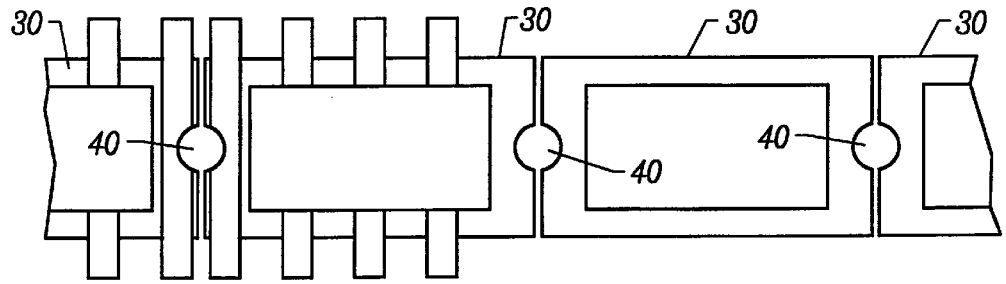
FIG. 4 is a top view illustrating the mounting of a plurality of packages of FIG. 3.
Figure 5:
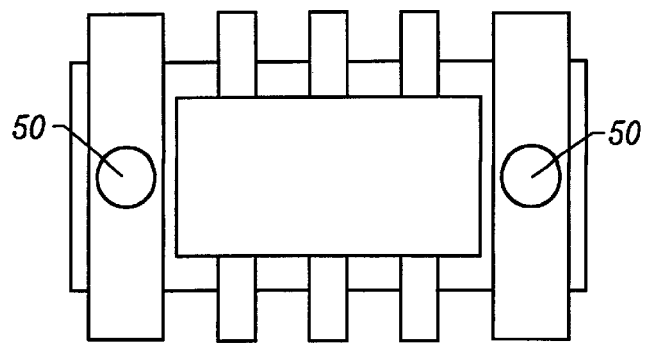
FIG. 5 is a plan view of another embodiment of a semiconductor device package in accordance with the invention.

FIG. 4 is a plan view illustrating the mounting of a plurality of packaged devices as illustrated in FIG. 3. It would be noted that a single fastener can engage recesses 40 of two adjacent devices and thus is shared by the two devices. Alternatively, as illustrated in FIG. 5, each semiconductor device can include a hole 50 for receiving a fastener, but then adjacent devices cannot share a fastener as in FIG. 4.

By using the mounting platform for the semiconductor device in mounting the package to a heat sink, a separate mounting bracket is not required thus reducing the cost of the device and another thermally troublesome interface is eliminated. Plus, piece parts cost and complexity are improved, effectively simplifying the mounting of the device to a heat sink. No metal plating of the ceramic platform bottom is required, but the platform can be metallized for solder down if desired.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A power semiconductor device package comprising:
   a semiconductor chip in which a semiconductor device is formed;
   a platform on which said semiconductor chip is mounted, said platform having recesses in opposed end portions with each recess mating with a recess of an adjacent platform to receive a fastener for fastening adjacent packages to a heat sink;
   a plurality of leads on and extending from the platform and electrically contacting the semiconductor chip; and
   a lid for enclosing the chip on the platform.

2. The power semiconductor device package of claim 1 wherein the platform comprises a ceramic material of sufficient platform thickness to withstand stress from fasteners.

3. The power semiconductor device package of claim 2 wherein the ceramic is selected from the group consisting of beryllium oxide and aluminum nitride.

4. The power semiconductor device package of claim 3 wherein the thickness is on the order of 0.120 inch.

5. The power semiconductor device package of claim 4 wherein the end portions include metal films which engage fasteners and spread stress from the fasteners over the end portions.

6. The power semiconductor device package of claim 5 wherein the metal films function as ground contacts.

7. The power semiconductor device package of claim 6 wherein the metal films are formed from a resilient material.

8. The power semiconductor device package of claim 7 wherein the resilient material comprises a polymer.

9. The power semiconductor device package of claim 6 wherein the lid comprises a ceramic which is attached to the platform by an epoxy.

10. The power semiconductor device package of claim 1 wherein the end portions include metal leads which engage fasteners and spread stress from the fasteners over the end portions.

11. The power semiconductor device package of claim 10 wherein the metal leads function as ground contacts.

12. The power semiconductor device package of claim 1 wherein the end portions include metal films which engage fasteners and spread stress from the fasteners over the end portions.

13. The power semiconductor device package of claim 1 wherein said metal films comprise a material selected from the group consisting of copper, nickel, Kovar, and Alloy 42.

* * * * *